(12) United States Patent
Topping (10) Patent No.: US 10,403,773 B2
(45) Date of Patent: Sep. 3, 2019

(54) OPTOELECTRONIC DEVICE AND METHOD OF PRODUCING THE SAME

(71) Applicant: Power Roll Limited, Sunderland (GB)

(72) Inventor: Alexander John Topping, Abingdon (GB)

(73) Assignee: Power Roll Limited, Sunderland (GB)

( * ) Notice: Subject to any disclaimer, the term of this patent is extended or adjusted under 35 U.S.C. 154(b) by 0 days.

(21) Appl. No.: 15/129,577

(22) PCT Filed: Mar. 27, 2015

(86) PCT No.: PCT/GB2015/050926
§ 371 (c)(1),
(2) Date: Sep. 27, 2016

(87) PCT Pub. No.: WO2015/145167
PCT Pub. Date: Oct. 1, 2015

(65) Prior Publication Data
US 2017/0170343 A1   Jun. 15, 2017

(30) Foreign Application Priority Data
Mar. 28, 2014   (GB) .................................. 1405663.4

(51) Int. Cl.
*H01L 31/0352* (2006.01)
*H01L 31/0236* (2006.01)
(Continued)

(52) U.S. Cl.
CPC .. *H01L 31/02366* (2013.01); *H01L 31/02363* (2013.01); *H01L 31/022425* (2013.01);
(Continued)

(58) Field of Classification Search
CPC ...... H01L 31/00; H01L 31/02; H01L 31/0216; H01L 31/02167; H01L 31/0352; H01L 31/04; H01L 31/035281; H01L 31/068
See application file for complete search history.

(56) References Cited

U.S. PATENT DOCUMENTS 3,948,682 A   4/1976   Bordina et al.
4,283,589 A   8/1981   Kaplow et al.
(Continued)

FOREIGN PATENT DOCUMENTS

EP   2256820   12/2010
WO   2012175902   12/2012

OTHER PUBLICATIONS

International Search Report and Written Opinion conducted in International Application No. PCT/GB2015/050926 dated Jun. 26, 2015.
(Continued)

*Primary Examiner* — Christina Chern
(74) *Attorney, Agent, or Firm* — Meunier Carlin & Curfman LLC (57) ABSTRACT

An optoelectronic device and method of producing the same. The optoelectronic device comprising a substrate having a first and a second substantially planar face and an aperture therein, the aperture passing through and penetrating the first and second substantially planar faces of the substrate. The aperture has a first and a second face defining a space therebetween. The space is at least partially filled with a first semiconductor material, the first face is coated with a conductor material and the second face is coated with a second semiconductor material.

11 Claims, 3 Drawing Sheets

(51) Int. Cl.
*H01L 31/042* (2014.01)
*H01L 31/05* (2014.01)
*H01L 31/047* (2014.01)
*H01L 31/0224* (2006.01)
*H01L 31/18* (2006.01)

(52) U.S. Cl.
CPC .... *H01L 31/035281* (2013.01); *H01L 31/042* (2013.01); *H01L 31/047* (2014.12); *H01L 31/0504* (2013.01); *H01L 31/18* (2013.01); *Y02E 10/50* (2013.01)

(56) References Cited

U.S. PATENT DOCUMENTS

| | | | |
|---|---|---|---|
| 2007/0034250 A1 | 2/2007 | Dutta | |
| 2010/0275964 A1* | 11/2010 | Kinoshita | H01L 31/022433 136/244 |
| 2011/0290323 A1* | 12/2011 | Lee | H01L 31/02168 136/256 |
| 2014/0238461 A1 | 8/2014 | Luo et al. | |

OTHER PUBLICATIONS

Kilmova et al. "High-Voltage Photovoltaic Cells with Alloyed Aluminum Contacts." Applied Solar Energy, 1992, 28(3), 20-24.
Examination report dated Jun. 14, 2018 received in corresponding European Application No. 15713803.3 (10 pages).

* cited by examiner

OPTOELECTRONIC DEVICE AND METHOD OF PRODUCING THE SAME

CROSS REFERENCE TO RELATED APPLICATIONS

This application is a United States national phase application of and claims priority to PCT No. PCT/GB2015/050926 filed on Mar. 27, 2015, which claims priority to Great Britain application Serial No. GB 1405663.4 filed on Mar. 28, 2014, both of which are incorporated entirely by reference as if fully set forth herein.

FIELD OF THE DISCLOSURE

The present invention relates to an optoelectronic device and more specifically a solar photovoltaic cell.

BACKGROUND

The term photovoltaic refers to the production of electricity, normally direct electrical current, from light at the junction between two materials that are exposed to the light. The light is normally sunlight and therefore photovoltaic is often referred to as solar photovoltaic. It is known to use semiconductors for the two materials. The semiconductor materials used exhibit a photovoltaic effect.

The two materials are usually semiconductors, a p-type and an n-type semiconductor material. When joined together the boundary or interface between the two types of semiconductor material is referred to as a p-n junction. This type of p-n junction is usually created by doping one material with the other material. The doping may be by diffusion, ion implantation or epitaxy. The later involves growing a second layer of crystal doped with one type of dopant on top of a first layer of crystal doped with a different type of dopant.

The p-n junction can be found in most optoelectronic devices that use semiconductors. These optoelectronic devices include photovoltaic or solar photovoltaic cells, diodes, light-emitting diodes (LEDs) and transistors. The p-n junction can be thought of as the active site where the generation or consumption of electrical energy occurs.

The demand for sources of renewable energy has driven significant improvements in the cost and efficiency of solar photovoltaic cells but existing technology still represents a relatively expensive method of generating electricity. Also, existing solar photovoltaic cells are relatively inefficient compared to other methods of generating electricity and are relatively fragile, that is they are relatively easily damaged.

One of the problems with existing solar photovoltaic cells is the difficulty producing a surface suitable for application of the necessary electrical conductor and semiconductor materials. Many known surfaces are difficult and therefore expensive to produce. The present invention aims to mitigate one or more of the disadvantages of existing solar photovoltaic cells.

BRIEF SUMMARY OF THE EMBODIMENTS

In accordance with a first aspect of the present invention there is provided an optoelectronic device comprising:
a substrate having a first and a second substantially planar face and an aperture therein, the aperture passing through and penetrating the first and second substantially planar faces of the substrate;
the aperture having a first and a second face defining a space therebetween; and
wherein the space is at least partially filled with a first semiconductor material, the first face is coated with a conductor material and the second face is coated with a second semiconductor material.

It may be an advantage of the present invention that the substrate having a first and a second substantially planar face and an aperture therein can be readily and/or reliably produced to provide a cost effective and/or robust optoelectronic device.

The aperture is typically one of a series and/or plurality of apertures, referred to hereinafter as a series of apertures. The substrate may have a first and a second series of apertures therein.

There may be a channel between the first and second series of apertures. It may be an advantage of the present invention that the channel separates the first and second series of apertures such that an electrical current can be taken from or supplied to the first series of apertures in isolation from the second series of apertures.

The first and second substantially planar faces are typically substantially parallel. The longitudinal axis of the aperture and/or the first and second series of apertures is typically perpendicular to the longitudinal axis and/or plane of the substrate.

The aperture and/or the first and second series of apertures is/are typically elongate in one dimension. The aperture and/or the first and second series of apertures may be elongate in the x-axis. The channel between the first and second series of apertures is typically an elongate channel. The aperture and/or the first and second series of apertures may be slot-shaped. The slot-shape may be elongate in one dimension. The slot-shape may be elongate in the x-axis.

The first and second faces of the aperture or each of the apertures of the first and second series of apertures may be coated with the conductor material. The first and second faces of the aperture or each of the apertures of the first and second series of apertures may also be coated with the second semiconductor material. The second face of the aperture or each of the apertures of the first and second series of apertures may also be coated with the second semiconductor material and the first face also coated with a third semiconductor material. The first semiconductor material at least partially filling the space may be an intrinsic semiconductor.

The first and second faces of each aperture or apertures 17a, 17b, 17c of the first and second series of apertures 18a and 18b may be referred to as the integral first and integral second faces respectively. The first face or integral first face is normally at a first angle relative to a normal from the substrate and the second face or integral second face at a second angle relative to a normal from the substrate. The first angle is normally from 45 to 90°. The first angle is normally 90°. The second angle is normally from 45 to 90°. The second angle is normally 90°.

The first and second angles can be any angle such that the first and second faces of each aperture or apertures of the first and second series of apertures can be selectively coated from either end of the aperture. The ends of the aperture may be a top and a bottom of the aperture. The first and second faces are typically selectively coated such that only one face at a time is coated.

The first semiconductor material is typically a p-type semiconductor material. The second semiconductor material is typically an n-type semiconductor material. The p-type semiconductor is therefore normally in the space of the aperture.

In an alternative embodiment the first semiconductor material is an n-type semiconductor material and the second semiconductor material is a p-type semiconductor material.

The n-type and p-type semiconductors may comprise one or more of silicon, amorphous silicon, hydrogenated amorphous silicon, aluminium, germanium, gallium nitride, gallium arsenide, aluminium phosphide, aluminium arsenide, copper iodide, zinc oxide and any other semiconductor.

The n-type semiconductor typically comprises one or more of silicon, germanium, phosphorus, selenium, tellurium, cadmium sulphide Copper Zinc Tin Sulfide (CZTS), Quantum Dot (QD) materials for example lead sulphide and organic materials for example perovskites.

The p-type semiconductor typically comprises one or more of silicon, germanium, cadmium telluride, copper indium gallium selenide, copper indium gallium diselenide ('CIGS'), copper oxide, boron, beryllium, zinc, cadmium, Copper Zinc Tin Sulfide (CZTS), Quantum Dot (QD) materials for example lead sulphide and organic materials for example perovskites.

The first and second semiconductor materials may meet at an interface and/or boundary. The interface is typically referred to as a p-n junction. The first and second semiconductor materials may together be referred to as an active material.

The active material may be deposited in the space and on the first and/or second face of the aperture or each of the apertures of the first and second series of apertures and may provide ohmic and rectifying contacts for insertion or extraction of charge from the active material. The active material may be one or more of photovoltaic, light emitting and ion conducting.

The second face of the aperture or each of the apertures of the first and second series of apertures may be coated with a conductor material and the second semiconductor material. The conductor material coated on the first face of the aperture or each of the apertures of the first and second series of apertures may be the same as the conductor material coated on the second face of the aperture or each of the of the first and second series of apertures, but it may be different. The conductor material coated on the first and/or second face of the aperture or each of apertures of the first and second series of apertures may comprise one or more of aluminium, bismuth, cadmium, chromium, copper, gallium, gold, indium, lead, magnesium, manganese, samarium, scandium, silver, tin and zinc.

The second semiconductor material may be an electron blocking material such as molybdenum trioxide. The first semiconductor material may be a heterojunction, that is a mixture of one or more of a p-type semiconductor, n-type semiconductor and donor acceptor material.

Typically a portion, normally a substantial portion, of the first and second series of apertures and channel therebetween are substantially parallel, typically parallel to one another. Normally the channel is parallel to the first and second series of apertures when it extends between the first and second series of apertures.

A surface of the substrate comprising the aperture or apertures of the first and/or second series of apertures and a channel therebetween may be referred to as a structured surface. The structured surface is typically not flat. The first substantially planar face of the substrate is typically not flat. The substrate may have another surface that is flat. The second substantially planar face of the substrate is typically flat.

The channels 42a, 42b may be referred to as a delineation features. The channels 42a, 42b typically separate the first and second series of apertures. Each channel typically has a first face 45a', 45a" and a second face 45b', 45b" and a channel cavity 45c', 45c" therebetween.

At least the first face of the channel may be coated with the conductor material and the second face of the channel may be coated with the second semiconductor material. The second face of the channel may also be coated with the conductor material. The channel cavity between the first and second faces of the channel is normally at least partially filled with the first semiconductor material.

The channel typically has a first face at a first angle relative to a normal from the substrate and a second face at a second angle relative to a normal from the substrate. The first face of the channel and the second face of the channel may be perpendicular to the plane of the substrate. The first angle is normally from 45 to 90°. The second angle is normally from 45 to 90°.

The angle that the first and second faces of each aperture or apertures of the first and second series of apertures are relative to a normal from the substrate is typically the same, at least substantially the same as the angle that the first and second face of the channel are relative to a normal from the substrate.

The first semiconductor material in the space, second semiconductor material on the second face and conductor material on at least the first face of the aperture and/or each aperture of the first and second series of apertures are normally all in electrical communication. The electrical communication is such that normally an electrical current can flow between the first and second semiconductor materials and the conductor material.

There is usually no electrical communication between the first semiconductor material in the channel cavity, second semiconductor material on the second face and conductor material on at least the first face of the channel.

The depth of the first semiconductor material in the cavity between the first and second faces of each of the aperture or apertures of the first and second series of apertures is substantially the same or at least similar to the depth of the first semiconductor material in the channel cavity between the first and second faces of the channel.

The aperture, typically the first and second faces of the aperture may be part of an electrical circuit. In use, the electrical communication may include the transfer of an electrical charge. The electrical charge typically includes an electrical current. Electricity in the electrical circuit may have one or more of a current of from 1 milliamp to 1 amp, a potential of from 0.1 to 3 volts and a power of from $1\times10^{-6}$ to 3 watts.

The first and second sides of the channel may be adjacent to the channel. The first and second sides of the channel may be at least substantially parallel to the plane of the substrate.

The channel is typically non-conductive. The channel typically separates and/or insulates the first and second series of apertures from one another.

The optoelectronic device may be referred to as a two terminal device. The first and second series of apertures may be referred to as cascaded aperture structures. In use the device may be fabricated in a series arrangement and operated in a parallel or a combined series and parallel arrangement.

The channel cavity between the first and second faces of the channel may be any shape and is normally U-shaped, V-shaped or semi-spherical. The channel cavity between the first and second faces of the channel may have a flat bottom.

The bottom of the channel cavity may be flat or may be rutted. The rutted bottom of the channel cavity may be referred to as uneven or rough. The rutted bottom of the channel cavity typically increases the surface area of the bottom of the channel cavity. Increasing the surface area of the bottom of the channel cavity may help to ensure the channel separates and/or insulates the first and second series of apertures from one another.

The channel typically has a depth measured from an upper surface of the substrate to a point in the channel furthest from the upper surface. The channel has a depth and a width. The depth of the channel is typically twice the width of the channel. The aspect ratio of the depth to the width of the channel is therefore typically 2:1.

The first and second series of apertures may typically each comprise from 2 to 500 apertures.

The inventor of the present invention has appreciated that, in contrast to the usual trend towards reducing the cost and increasing the efficiency of optoelectronic devices, if the costs are significantly reduced, may be by up to an order of magnitude, then the efficiency may be less important. When the optoelectronic device is a solar photovoltaic cell, this is particularly useful if the durability of the solar photovoltaic cells can be improved so that installation is relatively easy and therefore low cost and the solar photovoltaic cells have a greater range of application.

The optoelectronic device according to the first aspect of the present invention may be one or more of attached, secured and applied to a vehicle, for example a car or lorry, a house, for example a roof, and any other surface of a permanent structure. The permanent structure may be man-made or natural.

A surface that the optoelectronic device is one or more of attached, secured and applied to may be flat or uneven, that is one or more of rough, bumpy, irregular and/or rutted. The surface may be part of a building including a house and/or a domestic roof.

Each of the apertures of the first and second series of apertures is typically from 5 to 200 mm long, normally from 5 to 1000 mm long. Each of the apertures of the first and second series of apertures is typically from 0.1 to 150 µm wide, normally from 0.3 to 5 µm wide.

The substrate may comprise a curable resin and in particular a UV curable resin. The substrate may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The series of apertures may include a first outermost aperture and a second outermost aperture. There may be a hole in the substrate. The hole may provide electrical communication between an outermost aperture and the second substantially planar face of the substrate. In use, the hole is typically used to carry electrical charge between the first and the second substantially planar faces of the substrate, and typically from the first to the second substantially planar face of the substrate.

The second substantially planar face of the substrate typically further comprises a first electrical conductor 32a', 32a", or 32a''' and a second electrical conductor 32b'. The first and second electrical conductors are normally electrically insulated from one another, thereby helping to provide the separate electrical communication between the second outermost aperture 19b and the second substantially planar face 16 of the substrate.

The hole 44 typically passes through the first substantially planar face 14 of the substrate proximate an outermost aperture 19a and through the second electrical conductor 32b' on the second substantially planar face 16 of the substrate.

The first electrical conductor 32a', 32a", or 32a''' and second electrical conductor 32b' may provide and/or be part of the positive and negative poles of the electrical circuit. The first and second electrical conductors may comprise one or more of aluminum, copper, silver, zinc, lead, antimony, gold, nickel, bismuth, and indium.

The hole may have a diameter of from 0.5 to 2000 microns, typically from 10 to 50 microns. There may be at least one hole for every from 3 to 10 $cm^2$ of the substrate, typically at least one hole for every 5 $cm^2$ of the substrate.

The substrate is typically flexible. The substrate may be adhered to a supporting transparent layer. The substrate may be sandwiched between two supporting transparent layers. The supporting transparent layer or layers typically improve the mechanical strength of the optoelectronic device including the substrate and/or make the optoelectronic device easier to deploy.

The hole may be slot-shaped. The hole may have a circular cross-section. The hole may be elongate in one dimension. The hole may be elongate in the x-axis. The hole may be described as passing through the substrate.

The hole typically has a side or sides. The side or sides may be referred to as an internal surface/internal surfaces. The side or sides of the hole typically comprise the substrate. The side or sides of the hole and therefore the substrate that the side or sides comprise may provide the electrical communication.

The hole may be empty. The hole may be at least partially, typically substantially filled with a filler material. The filler material is typically an electrical conductor. The electrical conductor may be an ink. The ink may be a conductive ink. The filler material, typically the ink, may be substantially organic or substantially inorganic. The filler material, typically the ink, may comprise an organic binder. The filler material, typically the ink, may comprise one or more of carbon, silver, copper and lead.

When the hole is at least partially filled with the filler material, it is typically the filler material that provides the electrical communication between the outermost aperture and the second substantially planar face of the substrate.

The aspect ratio for the depth to the width of the hole is typically such that the conductor material and/or the semiconductor material coats enough of the side or sides of the hole to establish the electrical communication between the outermost aperture and the second substantially planar face of the substrate. The hole may be at least partially filled with the filler material to increase the reliability and/or effectiveness of the electrical communication between the first and second outermost apertures and the second substantially planar face of the substrate.

The hole may have been formed by an elongate member being pushed through the substrate from the first and/or second substantially planar face. The elongate member may remain in the substrate during use. The elongate member may provide the electrical communication between the first or second outermost aperture and the second substantially planar face of the substrate.

The elongate member may be a pin or a nail. The elongate member may be sized such that when it is in the hole, the elongate member is in contact with the conductor material and/or the semiconductor material on the side or sides of the hole. Contact between the elongate member and the conductor material and/or the semiconductor material on the side or sides of the hole typically helps provide the electrical communication between the first and second outermost apertures and the second substantially planar face of the substrate.

There may be a plurality of holes. It may be an advantage of the present invention that the number of holes in the substrate is such that the substrate is not structurally weakened. The holes of the plurality of holes typically have the same shape and/or design.

The side or sides of the hole may extend between, and in electrical communication with, the first and second substantially planar faces of the substrate may be coated with one or more of the conductor material, the first semiconductor material and the second semiconductor material. It is typically one or more of the conductor material, the first semiconductor material and the second semiconductor material that provides the electrical communication between the first outermost aperture and the second substantially planar face of the substrate and the second outermost aperture and separately the second substantially planar face of the substrate.

In accordance with a second aspect of the present invention there is provided a method of producing an optoelectronic device, the method including the steps of:

providing a substrate comprising a first and a second substantially planar face and an aperture therein, the aperture passing through and penetrating the first and second substantially planar faces of the substrate, the aperture having a first and a second face defining a space therebetween;

coating at least the first face of the aperture with a conductor material and coating the second face of the aperture with a semiconductor material; and at least partially filling the space with another semiconductor material.

The aperture is typically one of a series and/or plurality of apertures, referred to hereinafter as a series of apertures. The substrate may have a first and a second series of apertures therein. The series and/or first and second series of apertures normally includes a first outermost aperture and a second outermost aperture. There may be a hole in the substrate.

The step of coating at least the first face with the conductor material and coating the second face with the semiconductor material and/or the step of at least partially filling the space with the another semiconductor material, may also at least partially coat a side of and/or fill the hole with one or more of the conductor material, the semiconductor material and the another semiconductor material.

The method may separately include the step of creating the hole in the substrate. The step of creating the first and the second hole in the substrate may be before or after the step of coating at least the first face of the aperture with the conductor material and coating the second face of the aperture with the semiconductor material and/or the step of at least partially filling the cavity space with the another semiconductor material.

It may be an advantage of the present invention that when the substrate is provided with the hole therein, and/or the method separately includes the step of creating the hole in the substrate before the coating and filling steps, and then the hole is at least partially filled with one or more of the conductor material, the semiconductor material and the another semiconductor material, these materials provide the hole and/or substrate surrounding the hole with additional structural strength.

The hole typically provides electrical communication between the first outermost aperture and the second substantially planar face of the substrate.

The substrate typically also comprises a channel between the first and second series of apertures.

The semiconductor material coated on the second face of the aperture may be referred to as a second semiconductor material. The another semiconductor material at least partially filling the cavity may be referred to as a first semiconductor material.

The step of coating the at least first face of the aperture with the conductor material and coating the second face of the aperture with the semiconductor material is normally before the step of at least partially filling the cavity with the another semiconductor material.

The channel typically has a first and a second face and a channel cavity therebetween.

The step of at least partially filling the space between the first and second faces of the apertures with the another semiconductor material also typically at least partially fills the channel cavity with the another semiconductor material.

The first and second semiconductor materials are typically different. The first semiconductor material is typically a p-type semiconductor material. The second semiconductor material is typically an n-type semiconductor material.

The step of coating at least the first face of the aperture and/or each aperture of the first and second series of apertures with the conductor material and coating the second face of the aperture and/or each aperture of the first and second series of apertures with the semiconductor material typically comprises an off-axis directional coating process. The step of at least partially filling the space with the another semiconductor material typically comprises one or more of an off-axis directional coating process, directional coating process and uniform coating process.

The first and second faces of the apertures and/or first and second series of apertures and space therebetween are normally configured to be coated by an off-axis directional coating process.

The method step of coating at least the first face of the aperture and/or each aperture of the first and second series of apertures with the conductor material is typically before the step of coating the second face of the aperture and/or each aperture of the first and second series of apertures with the semiconductor material. The method step of at least partially filling the space with the another semiconductor material typically follows these coating steps.

The off-axis directional coating process may include spraying the conductor material and/or the semiconductor material at an angle relative to the plane of the substrate, and therefore also the aperture and/or each of the apertures of the first and second series of apertures, such that only the first or second face of the aperture and/or each aperture of the first and second series of apertures is coated. This is typically because the coating is substantially restricted by viewing angle of the coating process to only one of the first or second face.

The off-axis directional coating is typically performed in a partial vacuum. The partial vacuum normally ensures the coating material, typically a vapour, has a mean free path from a source to the substrate, that is a direct and un-diverted path free from interactions with gas molecules. The coating material may be the conductor material or the semiconductor material.

Generally the mean free path of travel of atomised coating material is comparable to the distance between the source and the surface of the substrate to be coated. Off-axis directional coating in a partial vacuum, also referred to as vacuum evaporation coating, at pressures below $10^{-4}$ mbar is typically directional due to the mean free path being approximately 600 mm. The source can be angled to the first or second substantially planar face of the substrate so that a restricted view of the surface of the substrate is presented and this restricted view allows for coating on selective parts of the substrate by a process of self-shadowing. The mean free path may also be defined as the length of a path an atom or molecule can travel before it is expected to have interacted with another atom or molecule. At atmospheric pressure the mean free path is typically 67 nm. Calculated using nitrogen as the total atmosphere and a partial vacuum level of 0.0001 mbar, the mean free path is typically 66 cm. At a partial vacuum of 0.00001 mbar, the mean free path increases to 6.6 meters.

The conductor material and/or the semiconductor material may be sprayed onto and/or towards the substrate at an angle relative to the plane of the substrate of from 25 to 90°, normally from 35 to 55°, and typically 45°. When the conductor material and/or the semiconductor material is sprayed onto the substrate at an angle relative to the plane of the substrate of from 25 to 90°, normally from 35 to 55° and typically 45°, coating the first face of the aperture with a conductor material and/or coating the second face of the aperture with a semiconductor material, coats the first and/or second face at least 25%, normally more than 50% of the length of the aperture away from the surface of the substrate nearest the source.

It may be an advantage of the present invention that coating the first or second face of the aperture with the conductor material or the semiconductor material or at least partially filling the space with the another semiconductor material at least 25%, normally more than 50% of the length of the aperture away from the surface of the substrate nearest the source helps to provide adequate, typically good electrical conduction from the first to the second substantially planar face of the substrate, and/or from the second to the first substantially planar face.

The angle at which the conductor material, the semiconductor material and/or the another semiconductor material is sprayed onto and/or towards the first substantially planar face of the substrate, may be the same, typically different from the angle at which the conductor material, the semiconductor material and/or the another semiconductor material is sprayed onto and/or towards the second substantially planar face of the substrate.

The hole may be slot-shaped. It may be an advantage of the present invention that when the hole is slot-shaped, the aspect ratio for the depth to the width of the hole may improve the viewing angle of the coating process for at least one, normally at least two, of the sides of the hole.

The off-axis directional coating process may include using a shield to restrict the coating of the conductor material and/or the semiconductor material onto the at least first and/or second face of the aperture and/or each aperture of the first and second series of apertures. The off-axis directional coating process may be repeated using more than one conductor material and/or semiconductor material.

The step of providing the substrate typically includes patterning a surface of the substrate to produce a structured surface.

The optional features of the first aspect of the present invention can be incorporated into the second aspect of the present invention and vice versa.

BRIEF DESCRIPTION OF THE FIGURES

An embodiment of the invention will now be described by way of example only and with reference to the accompanying drawings, in which.

DETAILED DESCRIPTION

Figure 1:
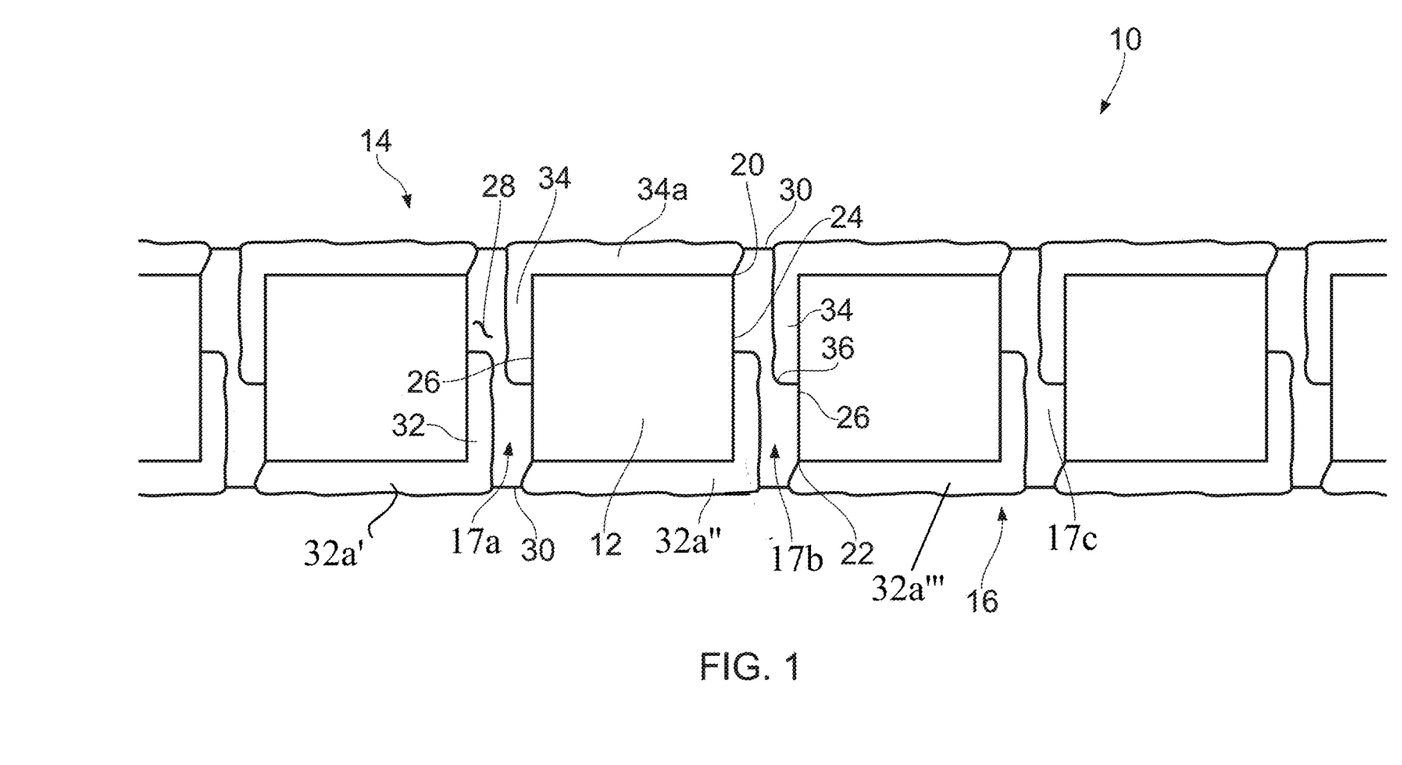
FIG. 1 is a cross-sectional view of part of an optoelectronic device of the present invention.

FIG. 1 shows an optoelectronic device 10. The optoelectronic device 10 comprises a substrate 12 having a first 14 and a second 16 substantially planar face and apertures 17a, 17b, 17c therein. The apertures 17a, 17b, 17c pass through the substrate 12 and penetrate the first 14 and second 16 substantially planar faces of the substrate 12 at 20 & 22.

The apertures 17a, 17b, 17c have a first 24 and a second 26 face defining a space 28 therebetween. The space 28 is at least partially filled with a first semiconductor material 30, the first face 24 is coated with a conductor material 32 and the second face 26 is coated with a second semiconductor material 34.

The conductor material 32 coated on the first face 24 extends out of the apertures 17a, 17b, 17c and onto the second substantially planar face 16 of the substrate 12. The second semiconductor material 34 coated on the second face 26 extends out of the apertures 17a, 17b, 17c and onto the first substantially planar face 14 of the substrate 12.

The apertures 17a, 17b, 17c are each one of a series of apertures 18a and 18b; each aperture is the same.

In use, light contacts either side of the substrate, the first 14 and second 16 substantially planar faces. The first semiconductor material 30 in the space 28, second semiconductor material 34 on the second face 26 and conductor material 32 on the first face 24 of each of the apertures 17a, 17b, 17c are all in electrical communication. The electrical communication is such that an electrical current, generated as a result of light contacting the first 30 and the second 34 semiconductor materials, can flow between the first 30 and second 34 semiconductor materials and the conductor material 32a', 32a'', 32a'''.

The first 30 and second 34 semiconductor materials meet at an interface 36. The interface 36 is a p-n junction.

Figure 2:
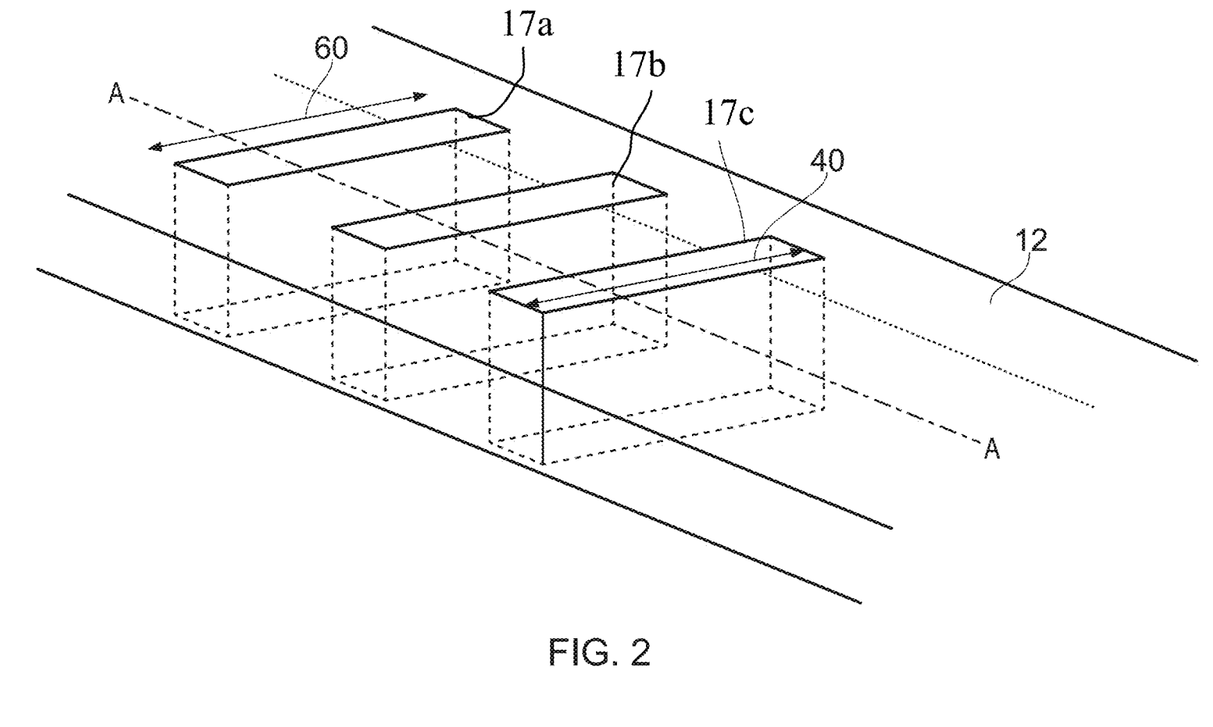
FIG. 2 is a perspective view of part of the optoelectronic device also shown in FIG. 1.

FIG. 2 shows a perspective view of part of the optoelectronic device 10 also shown in FIG. 1. The cross-section shown in FIG. 1 is along the line A-A shown in FIG. 2.

The apertures 17a, 17b, 17c in the substrate 12 are elongate in one dimension 40. The apertures 17a, 17b, 17c are 100 mm long and 5 μm wide. There are ten (not shown) apertures in the substrate 12.

FIG. 2 also shows the x-axis 60 of the apertures 17a, 17b, 17c.

Figure 3:
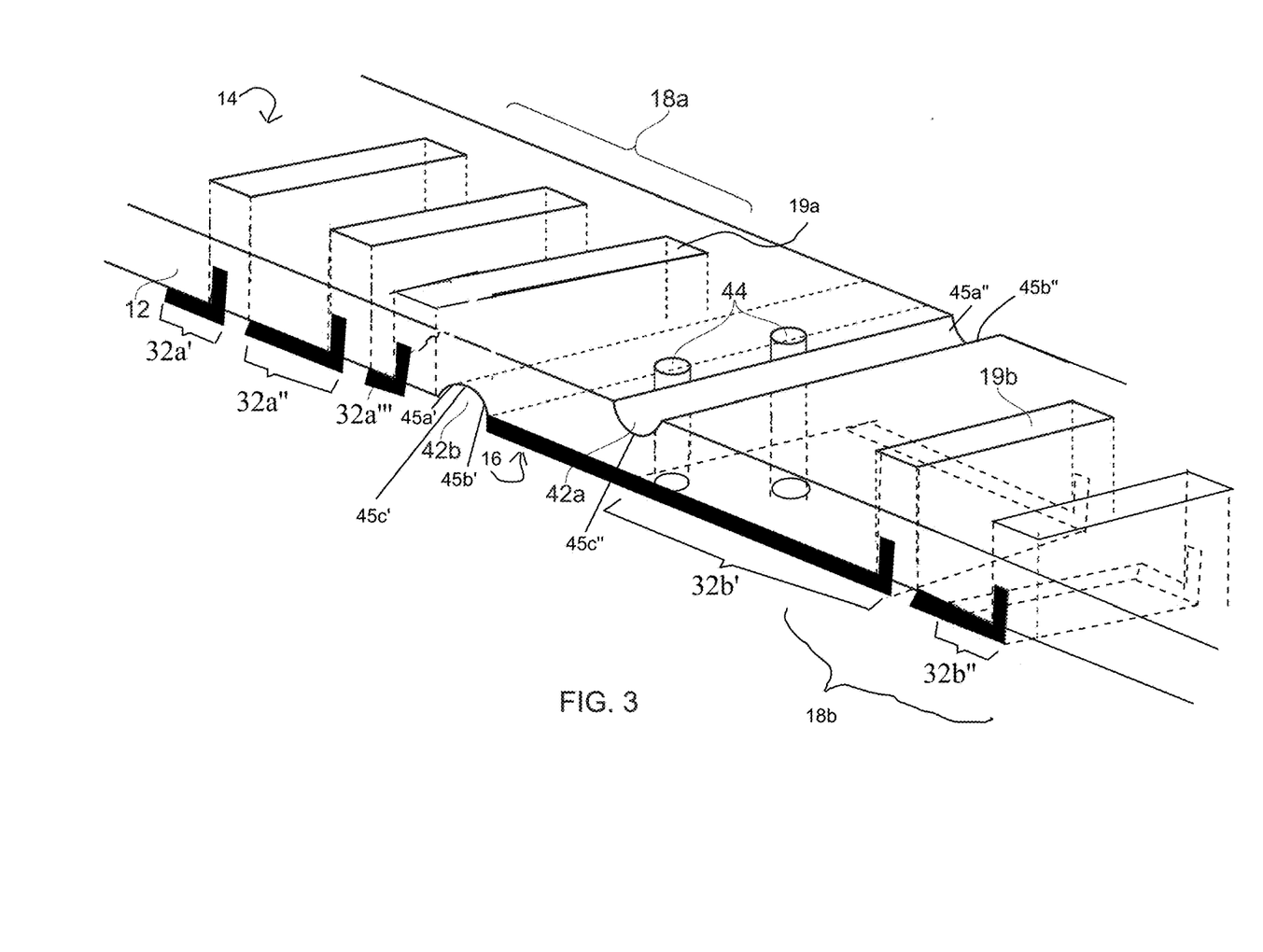
FIG. 3 is a perspective view of the optoelectronic device also shown in part in FIGS. 1 and 2.

FIG. 3 shows a perspective view of the optoelectronic device 10 also shown in part in FIGS. 1 and 2.

FIG. 3 shows two channels 42a and 42b between a first 18a and second 18b series of apertures. The channels 42a and 42b separate the first and second series of apertures 18a and 18b such that in use, an electrical current can be taken from the first series of apertures 18a in isolation from the second series of apertures 18b. The channel is electrically non-conductive.

The series of apertures 18a includes a first outermost aperture 19a and a second outermost aperture (not shown).

The series of apertures 18b includes a first outermost aperture (not shown) and a second outermost aperture 19b.

There is a 44 hole in the substrate 12. The hole 44 provides electrical communication between the first outermost aperture 19a and the second substantially planar face 16 of the substrate 12.

In use, the hole 44 is used to carry electrical charge between the first and the second substantially planar faces 14 and 16 of the substrate 12.

The inner surfaces (not shown) of the hole 44 extending between, and in electrical communication with, the first and second substantially planar faces of the substrate 12, are coated with a conductor material to provide a pathway for an electrical current between the first outermost aperture 19a and the second substantially planar face 16 of the substrate 12 and the second outermost aperture 19b and separately the second substantially planar face 16 of the substrate 12.

Modifications and improvements can be incorporated herein without departing from the scope of the invention.

The invention claimed is:

1. An optoelectronic device comprising:
   a substrate comprising at least one substrate material and having a first substantially planar face, a second substantially planar face, and apertures passing through the substrate, the apertures penetrating the first substantially planar face and the second substantially planar face and the apertures each having a first face and a second face,
   wherein the first face supports a conductor material in direct contact with the first face,
   wherein the second face supports a second semiconductor material in direct contact with the second face, and
   wherein a remaining space in the respective aperture, between the conductor material and the second semiconductor material, is at least partially filled with a first semiconductor material in direct contact with the conductor material and the second semiconductor material;
   wherein the at least one substrate material is different from the first semiconductor material, the second semiconductor material, and the conductor material;
   wherein the conductor material on the first face extends out of the apertures and onto the second substantially planar face of the substrate and the second semiconductor material on the second face extends out of the apertures and onto the first substantially planar face of the substrate;
   wherein the conductor material is selected from the group consisting of antimony, aluminum, bismuth, cadmium, chromium, copper, gallium, gold, indium, lead, magnesium, manganese, nickel, samarium, scandium, silver, tin, zinc, and combinations thereof;
   wherein the first semiconductor material is a p-type semiconductor material and the second semiconductor material is an n-type semiconductor material; and
   wherein the n-type semiconductor material comprises one or more of silicon, germanium, phosphorus, selenium, tellurium, cadmium sulfide, Copper Zinc Tin Sulfide (CZTS), a Quantum Dot (QD) material and an organic material.

2. The optoelectronic device as claimed in claim 1, further comprising a first series of the apertures and a second series of the apertures,
   wherein the device further comprises a first non-conductive channel extending from the first substantially planar face into the substrate and a second non-conductive channel extending from the second substantially planar face into the substrate,
   wherein the first non-conductive channel and the second non-conductive channel are positioned between the first series of apertures and the second series of apertures, the non-conductive channels separating the first series of apertures and second series of apertures.

3. The optoelectronic device according to claim 1, wherein the first face and the second face of the apertures comprise respective portions in direct contact with the first semiconductor material.

4. The optoelectronic device according claim 1 wherein the p-type semiconductor comprises one or more of silicon, germanium, cadmium telluride, copper indium gallium selenide ('CIGS'), copper indium gallium diselenide, copper oxide, boron, beryllium, zinc, cadmium, Copper Zinc Tin Sulfide (CZTS), a Quantum Dot (QD) material and an organic material.

5. The optoelectronic device according to claim 2, wherein each of the first non-conductive channel and the second nonconductive channel defines a respective channel cavity that is U-shaped or V-shaped relative to the substrate.

6. The optoelectronic device according to claim 5, wherein a bottom of each respective channel cavity is flat or rutted.

7. The optoelectronic device according to claim 2, further comprising:
   wherein the first series of apertures comprises a first outermost aperture proximate the second non-conductive channel and the second series of apertures comprises a second outermost aperture proximate the first non-conductive channel;
   wherein there is a hole extending through the substrate between the first non-conductive channel and the second non-conductive channel, the hole comprising an electrically conductive filler connecting the second semiconductor material extending out of the first outermost aperture to the conductor material extending out of the second outermost aperture; and
   wherein the electrically conductive filler in the hole and the conductor material extending out of the second outermost aperture provide electrical communication from the first outermost aperture to the second outermost aperture.

8. The optoelectronic device according to claim 7, wherein the hole has a diameter of from 0.5 to 2000 microns.

9. The optoelectronic device according to claim 7, wherein the electrically conductive filler is an ink.

10. An optoelectronic device comprising:
    a substrate comprising at least one substrate material and having a first substantially planar face, a second substantially planar face, and apertures passing through the substrate, the apertures penetrating the first substantially planar face and the second substantially planar face;
    the apertures each having a first face and a second face defining a space therebetween
    wherein the space is partially filled with a first semiconductor material extending from the first substantially planar face to the second substantially planar face,
    wherein the first face supports a conductor material directly abutting the substrate material and the first semiconductor material, and
    wherein the second face supports a second semiconductor material directly abutting the substrate material and the first semiconductor material;
    wherein the at least one substrate material is different from the first semiconductor material, the second semiconductor material, and the conductor material;

wherein the conductor material on the first face extends out of the apertures and onto the second substantially planar face of the substrate and the second semiconductor material on the second face extends out of the apertures and onto the first substantially planar face of the substrate; and wherein the first semiconductor material is an n-type semiconductor material and the second semiconductor material is a p-type semiconductor material.

11. The optoelectronic device according to claim 5, wherein each of the first non-conductive channel and the second nonconductive channel has first and second faces defining the channel cavity therebetween.

\* \* \* \* \*